United States Patent
Yang et al.

(10) Patent No.: US 9,621,141 B1
(45) Date of Patent: Apr. 11, 2017

(54) MICRO-PIPELINE FREQUENCY-COMPARISON CIRCUIT

(71) Applicant: Oracle International Corporation, Redwood Shores, CA (US)

(72) Inventors: Suwen Yang, Mountain View, CA (US); Frankie Y. Liu, Palo Alto, CA (US); Vincent C. Lee, San Mateo, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/992,905

(22) Filed: Jan. 11, 2016

(51) Int. Cl.
  *H03L 7/00* (2006.01)
  *H03L 7/06* (2006.01)
  *H03K 5/05* (2006.01)
  *H03L 7/091* (2006.01)

(52) U.S. Cl.
  CPC .............. *H03K 5/05* (2013.01); *H03L 7/091* (2013.01)

(58) Field of Classification Search
  USPC ........ 327/115, 116, 117, 118, 199, 355–360, 327/202, 203, 208–215, 218; 377/47, 48
  See application file for complete search history.

(56) References Cited

U.S. PATENT DOCUMENTS

| | | | | |
|---|---|---|---|---|
| 2002/0109538 A1* | 8/2002 | Yamauchi | .............. | H03H 11/26 327/270 |
| 2015/0146869 A1* | 5/2015 | Yamamoto | ........... | H03K 3/0375 380/44 |
| 2016/0267266 A1* | 9/2016 | Yamamoto | ............... | G09C 1/00 |

* cited by examiner

*Primary Examiner* — Brandon S Cole
(74) *Attorney, Agent, or Firm* — Park, Vaughan, Fleming & Dowler LLP

(57) ABSTRACT

In an integrated circuit, a resettable data latch and a second resettable data latch at ends of a pipeline in a frequency-comparison circuit receive input clocks. This pipeline operates asynchronously and includes at least a pair of flow-control elements separated by a NAND-gate detector circuit. Moreover, the resettable data latch and the second resettable data latch selectively generate tokens and spaces based on rising or falling edges of the input clocks. Then, the frequency-comparison circuit moves the tokens and the spaces in the pipeline between the ends based on a difference in fundamental frequencies of the input clocks. Furthermore, arbiter circuits in the frequency-comparison circuit provide output signals based on changes in numbers of tokens proximate to the ends, to indicate how at least one of the input clocks should be adjusted so that the fundamental frequencies converge on a common value.

20 Claims, 13 Drawing Sheets

MICRO-PIPELINE FREQUENCY-COMPARISON CIRCUIT

BACKGROUND

Field

The present disclosure generally relates to a frequency-comparison circuit. More specifically, the present disclosure relates to a frequency-comparison circuit that includes a pipeline that operates asynchronously and provides output signals that specify adjustments to input clocks so that their fundamental frequencies converge on a common value.

Related Art

Phase-locked loops (PLL) are well-known and widely used feedback circuits. In these feedback circuits, the output of a local oscillator is typically divided down and compared to a reference oscillator. The comparison result is then filtered and fed back into the local oscillator to adjust its frequency and phase. PLLs allow a stable, digital output clock to be generated based on a slower reference input clock.

As illustrated in FIG. 1, in existing PLLs the typical frequency-comparison circuit is a phase-frequency detector. The phase-frequency detector compares the relative phases and frequencies of two digital clocks, such as an input clock (Ref) and a local oscillator (LO). Output signals ('speed up' and 'slow down') are often used to adjust the local oscillator to ensure the compared clocks are at the same frequency and are kept in-phase.

Frequency-locked loops (FLLs) are also well-known and widely used feedback circuits. In FLLs, the two clocks need not be in-phase, but their frequencies must be kept the same. Thus, in FLLs, frequency-comparison circuits are deployed instead, and they are typically implemented as digital counters or frequency-to-voltage converters.

However, the phase-frequency detector in existing PLLs and the frequency-comparison circuits in existing FLLs are often implemented using synchronous circuits. These synchronous circuits can be difficult to design over a wide range of operating conditions and often increase the power consumption of integrated circuits that include existing PLLs and FLLs. For example, as illustrated in FIG. 1, phase-frequency detectors often have a non-ideal reset delay.

Hence, what is needed is an integrated circuit without the above-described problems.

SUMMARY

One embodiment of the present disclosure provides a frequency-comparison circuit with a pipeline. This pipeline includes: a resettable data latch at an end of the pipeline that receives an input clock having a fundamental frequency; and an arbiter circuit electrically coupled to the resettable data latch. Moreover, the pipeline includes: a flow-control element coupled to the resettable data latch and the arbiter circuit; a NAND-gate detector circuit electrically coupled to the flow-control element; and a second flow-control element electrically coupled to the NAND-gate detector circuit. Furthermore, the pipeline includes: a second arbiter circuit electrically coupled to the second flow-control element; a second resettable data latch at a second end of the pipeline electrically coupled to the second flow-control element and the second arbiter circuit, which receives a second input clock having a second fundamental frequency. Additionally, the resettable data latch selectively generate tokens based on rising edges and/or falling edges in the input clock. In addition, the second resettable data latch selectively generate spaces based on rising edges and/or falling edges in the second input clock. Then, the pipeline moves the tokens based on the fundamental frequency from the end to the second end, and the pipeline moves the spaces based on the second fundamental frequency, from the second end to the end. Next, the arbiter circuit provides an output signal that specifies an adjustment to one of the input clock and the second input clock (such as a speed-up adjustment) based on a change in a number of tokens proximate to the end and the second arbiter circuit provides a second output signal that specifies an adjustment to another one of the input clock and the second input clock (such as a slow-down adjustment) based on a change in a number of spaces proximate to the second end, so that the fundamental frequency and the second fundamental frequency converge on a common value.

Note that a given flow-control element may include a set-reset (SR) latch. In particular, a given flow-control element includes one of: an asP* module, a GasP module, and a Muller C-element. During initialization of the frequency-comparison circuit, Q outputs from the resettable data latch and the flow-control element may be set to a first state and the Q outputs from the second flow-control element and the second resettable data latch may be set to a second state.

Moreover, the frequency-comparison circuit may operate asynchronously.

Furthermore, the frequency-comparison circuit may include one or more additional instances of flow-control elements and NAND-gate detector circuits arranged in series in the pipeline. For example, the frequency-comparison circuit may include at least four flow-control elements and at least three NAND-gate detector circuits, so that the frequency-comparison circuit avoids false positives in the output signal and the second output signal for an arbitrary value of a phase difference between the input clock and the second input clock.

Additionally, a difference of a greater of a forward propagation time through the pipeline and a reverse propagation time through the pipeline minus an inverse of one of the fundamental frequency and the second fundamental frequency may be less than or equal to a clock skew between the input clock and the second input clock.

Note that the frequency-comparison circuit may be included in a phase-locked loop (PLL) and/or a frequency-locked loop (FLL).

Some embodiments include two instances of the frequency-comparison circuit. After performing a comparison of the input clock and the second input clock, one of the two instances of the frequency-comparison circuit may be reset and initialized while another of the two instances of the frequency-comparison circuit may perform another comparison of the input clock and the second input clock.

Another embodiment provides a method for comparing an input clock and a second input clock, which may be performed using the frequency-comparison circuit.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way.

Other features, aspects, and advantages of the subject matter described herein will become apparent from the following Detailed Description, Figures, and Claims.

Figure 3:
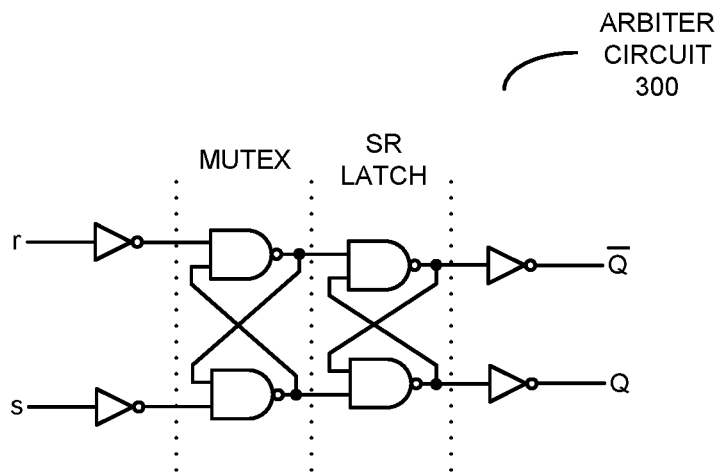
FIG. 3 is a block diagram illustrating an arbiter circuit in accordance with an embodiment of the present disclosure.

Table 1 provides a truth table for the arbiter circuit of FIG. 3 in accordance with an embodiment of the present disclosure.

Table 2 provides a state summary for a frequency-comparison circuit in accordance with an embodiment of the present disclosure.

Table 3 provides a state summary for a frequency-comparison circuit in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of an integrated circuit, an electronic device that includes the integrated circuit, and a method for comparing an input clock and a second input clock are described. In the integrated circuit, a resettable data latch and a second resettable data latch at ends of a pipeline in a frequency-comparison circuit receive the input clocks. This pipeline operates asynchronously and includes at least a pair of flow-control elements separated by a NAND-gate detector circuit. Moreover, the resettable data latch and the second resettable data latch selectively generate tokens and spaces based on rising and/or falling edges of the input clocks. Then, the frequency-comparison circuit moves the tokens and the spaces in the pipeline between the ends based on a difference in fundamental frequencies of the input clocks. Furthermore, arbiter circuits in the frequency-comparison circuit provide output signals based on changes in numbers of tokens and spaces proximate to the ends, to indicate how at least one of the input clocks should be adjusted so that the fundamental frequencies converge on a common value.

The frequency-comparison circuit and the integrated circuit may provide simpler digital designs and lower power consumption than existing frequency-comparison circuits. Therefore, relative to existing integrated circuits, this frequency adjustment technique may reduce the cost, complexity and time to market of the integrated circuit, as well as improve its performance.

We now describe embodiments of components in the frequency-comparison circuit, including micro-pipeline control logic and arbiter circuits. In many modern system-on-a-chip (SOC) designs, numerous parts of a chip may operate in different clock domains. In order to facilitate data movement across these domain boundaries, high-speed asynchronous first-in-first-out memory (FIFOs) are used (which are sometimes referred to as 'micro-pipelines' or 'pipelines').

Because the producer and consumer of data across clock domains usually operate at different frequencies, asynchronous flow control is often used to facilitate micro-pipeline operation. Representative flow control circuits include asP*, GasP, and the 2-phase Muller C-element circuit. A complete micro-pipeline control may include a cascade of flow control circuits. However, regardless of the flow-circuit implementation, micro-pipeline control may operate under the following paradigm: acknowledge and request signals facilitate the passing of tokens from preceding stages to succeeding stages of the micro-pipeline and the passing of spaces from the succeeding stages to preceding stages of the micro-pipeline.

Figure 1:
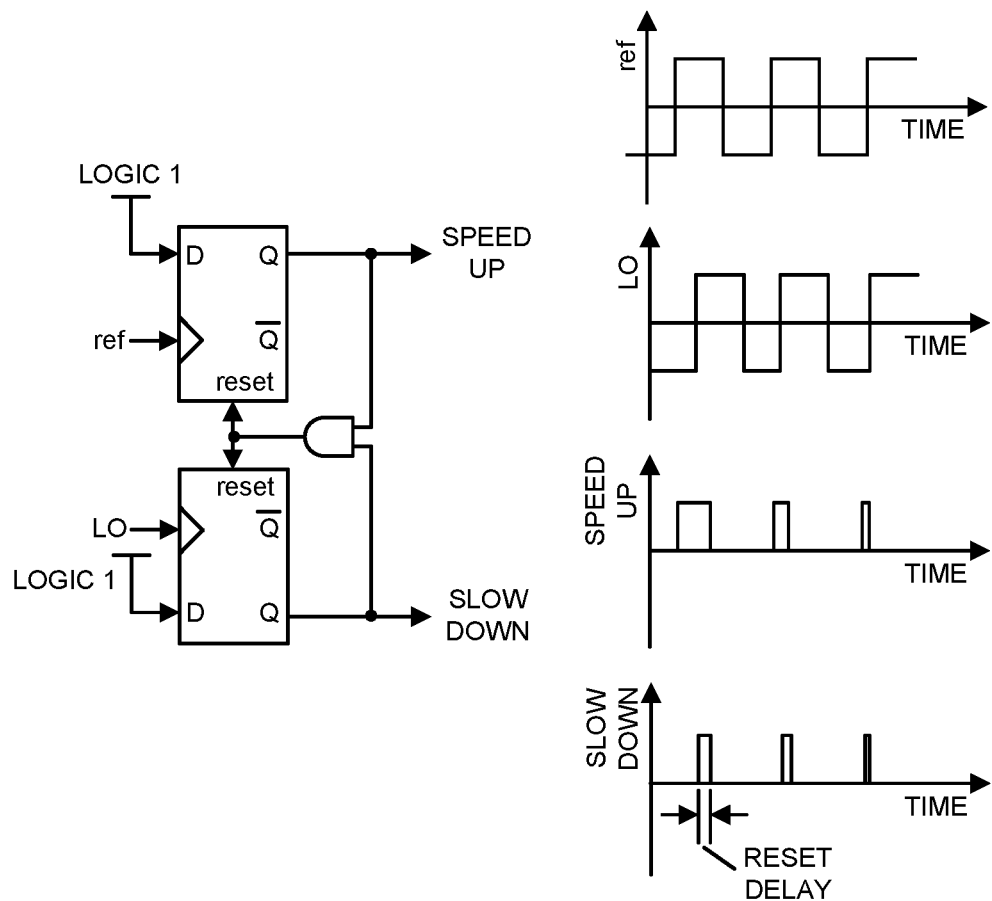
FIG. 1 is a drawing illustrating an existing phase-frequency detector circuit.
Figure 2:
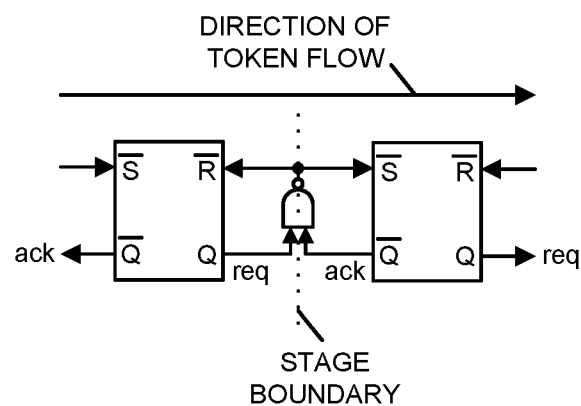
FIG. 2 is a block diagram illustrating an asP* control circuit in accordance with an embodiment of the present disclosure.

FIG. 2 presents a block diagram illustrating an asP* control circuit in a micro-pipeline with NAND set-reset (SR) latches and a NAND-gate. Note that req denotes the request signal for a token to proceed down the micro-pipeline, while ack denotes the acknowledge signal permitting the token to proceed.

At each stage boundary in the micro-pipeline, the NAND-gate may resolve two events: the arrival of a token at the preceding stage which causes the request signal to go HI, and the announcement of a space in the succeeding stage which may cause the acknowledge signal to go HI. When both of these events have occurred, the token may be passed from a preceding stage to a succeeding stage and the space may be passed from the succeeding stage to the preceding stage. The token may continue to ripple forward through the circuit until there is no space available in a succeeding stage. When the preceding stage supplies a token before the succeeding stage provides a space, the micro-pipeline may be said to be locally 'congested' at that segment. In contrast, when the succeeding stage provides a space before the preceding stage supplies a token, the micro-pipeline may be said to be locally 'starved' at that segment. This behavior of the micro-pipeline may be nominally used to facilitate the flow of data in high-speed asynchronous ripple FIFOs, but the same underlying mechanism may be repurposed for the proposed frequency-comparison circuit.

In asynchronous circuit designs, arbiter circuits are commonly used to resolve the arrival sequence of two events, producing a grant event to indicate which arrived first. FIG. 3 presents a block diagram illustrating an arbiter circuit 300 with a mutual exclusion (MUTEX) element, an SR latch, and inverters. The MUTEX element may perform the arbitration between two LO-to-HI transitioning inputs, r (reset) and s (set). Then, the MUTEX element may reset or set an SR latch to hold its decision. The overall arbiter-circuit behavior is represented in the truth table shown in Table 1. Even though the MUTEX and SR latch have the same topology, note that a distinction is intentionally made to differentiate their respective roles in the overall arbiter-circuit behavior.

TABLE 1

| r | s | Q |
|---|---|---|
| 1 | 1 | No change |
| 1 | 0 | 0 |
| 0 | 1 | 1 |
| 0 | 0 | No change |

Figure 4:
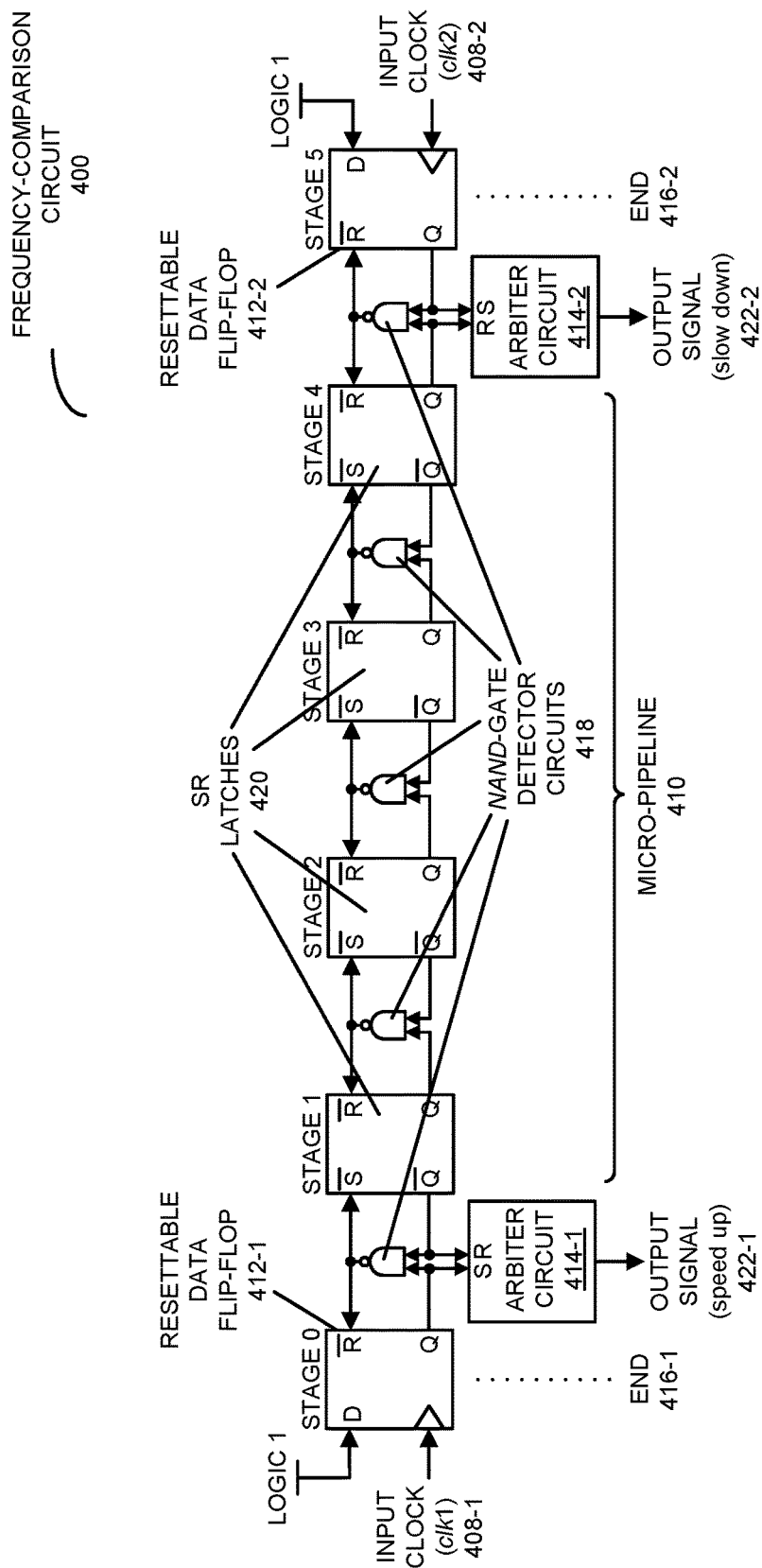
FIG. 4 is a block diagram illustrating a frequency-comparison circuit in accordance with an embodiment of the present disclosure.

We now describe embodiments of the frequency-comparison circuit. The micro-pipeline control logic and arbiter circuits may be used as building blocks in the frequency-comparison (or comparator) circuit. FIG. 4 presents a block diagram illustrating a frequency-comparison circuit 400 with a four-stage asP* micro-pipeline 410, i.e., stages 1-4, with resettable data flip-flops 412 (and, more generally, resettable data latches) and arbiter circuits 414 at each of ends 416 (which indicate whether a respective end is filled with or empty of tokens, and more generally has more or fewer than 50% tokens). As described further below, the initialization for stages 0-5 in FIG. 4 is 0, 0, 0, 1, 1, 0. Moreover, as shown in FIG. 4 (and FIG. 5 below), the four stages in the micro-pipeline include NAND-gate detector circuits 418 and flow-control elements. (In FIG. 5, data flip-flop 412-3 is settable, but is not resettable.) For purposes of illustration, the flow-control elements include SR latches 420. More generally, the flow-control elements may include: an asP* module or circuit, a GasP module or circuit, and/or a Muller C-element.

In frequency-comparison circuit 400, input clocks 408 (clk1 and clk2) are compared. In particular, the reference clock is represented by clk1, and the local oscillator is represented by clk2. Note that output signals 422, 'speed up' and 'slow down,' indicate in which direction the local oscillator (clk2) should be adjusted relative to the reference clock (clk1), with the intent of making the two converge on the same fundamental frequency. For example, control logic (not shown) may adjust the reference clock and/or the local oscillator based on output signals 422. In some embodiments, only the local oscillator is adjusted. However, in other embodiments both the reference clock and local oscillator are adjusted.

Figure 5:
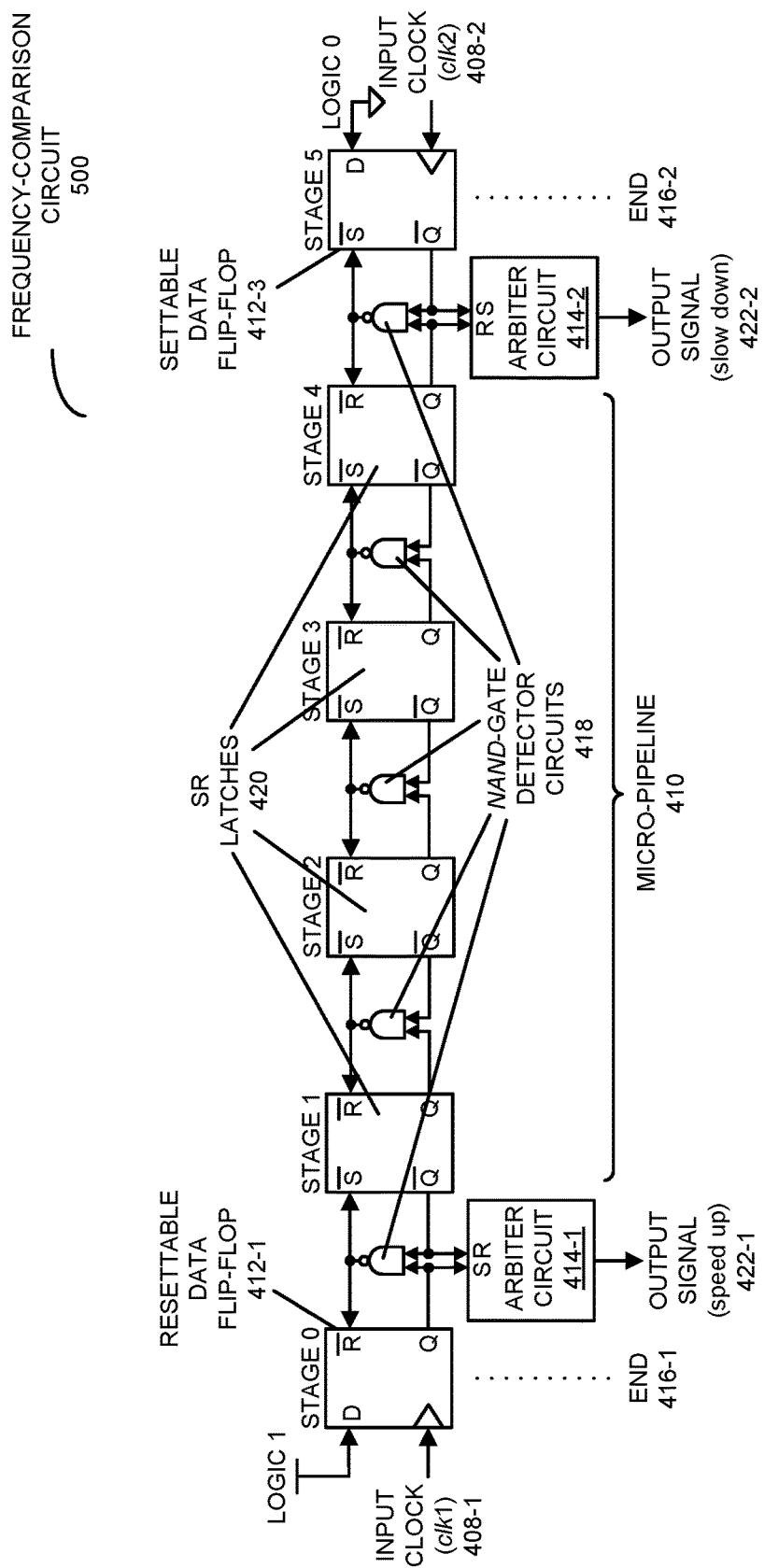
FIG. 5 is a block diagram illustrating a frequency-comparison circuit in accordance with an embodiment of the present disclosure.

An alternative implementation is shown in FIG. 5, which presents a block diagram illustrating a frequency-comparison circuit 500. In particular, frequency-comparison circuit 500 uses a different stage 5 flip-flop. However, the two embodiments are logically equivalent. Note that the initialization for stages 0-5 in FIG. 5 is 0, 0, 0, 1, 1, 1.

In FIGS. 4 and 5, care may be needed in the timing of the first two and last two stages, which are connected to 'speed up' arbiter circuit 414-1 and 'slow down' arbiter circuit 414-2, respectively. In the ideal case, when a token is passed from Stage 0 to Stage 1, the two stages may change state instantaneously and at the same time. In practice, there may be variations that cause one stage to change state before the other. If Stage 1 changes from empty to full before Stage 0 changes from full to empty, then arbiter circuit 414-1 may be falsely triggered to output a 'HI' on output signal 422-1. In order to remedy this, Stage 0 may always change state before Stage 1. Thus, the path connecting the NAND gate output to Stage 0 may be faster than the path to Stage 1. By a similar argument, Stage 5 may change state before Stage 4. Thus, the path from the NAND gate output to Stage 5 may be faster than the one to Stage 4. Stated succinctly, Stage 0 may change state before Stage 1 at end 416-1 of the pipeline and Stage 5 may change state before Stage 4 at end 416-2 of the pipeline. This condition may be necessary to prevent false positives on output signals 422.

Both of the embodiments of the frequency-comparison circuit may require an initialization phase before proper operation. The following discussion refers to the embodiment shown in FIG. 5. The Q outputs of stages 0, 1, and 2 may be reset into the LO state, whereas the Q outputs of stages 3, 4, and 5 may be set into the HI state. A stage with a LO state is referred to as 'empty,' while a stage with a HI state is referred to as 'full.' Moreover, an 'empty' stage is said to contain a space, while a 'full' stage is said to contain a token. Note the number of empty states on the left half of the frequency-comparison circuit may equal the number of full states on the right half. Under these conditions and in accordance with the truth table of Table 1, both arbiter circuits, respectively, may output LO for the 'speed up' and 'slow down' output signals 422. This configuration may be the starting or the initialization state of the frequency-comparison circuit.

Upon exiting the initialization phase, the frequency-comparison circuit may begin accepting inputs from the clk1 and clk2 clock sources. As long as there are no rising edges on clk1 or clk2, the frequency-comparison circuit may remain in the initialization state because tokens may be inserted or removed on rising edges of a clock. (However, in other embodiments, tokens may be inserted or removed on falling edges of a clock, or on both edges of a clock.) Upon a rising edge of clk1, stage 0 may generate a token into the asP* micro-pipeline. This token may ripple forward in the micro-pipeline until it reaches an already full stage. Moreover, upon a rising edge of clk2, stage 5 may remove a token from the micro-pipeline and may generate a space. Note that a token may move into the next stage to its right if that next stage has a space. As long as clk1 and clk2 are at the same frequency, there may be equal rates of token insertion and removal in the micro-pipeline. Under this condition, the micro-pipeline may remain half-full or half-empty, and the 'speed up' and 'slow down' output signals 422 may stay LO.

However, if clk1 is faster than clk2, there may be a buildup of tokens in the micro-pipeline. When the micro-pipeline becomes congested, stage 1 may become full first followed by stage 0, causing the 'speed up' output signal 422-1 to go HI to indicate that clk2 needs to speed up. In contrast, if clk2 is faster than clk1, there may be a depletion of tokens in the micro-pipeline. When the micro-pipeline becomes starved, stage 4 may become empty first followed by stage 5, causing the 'slow down' output signal 422-2 to go HI to indicate clk2 needs to slow down.

After a comparison is made, i.e., if either the 'speed up' or 'slow down' output signals 422 turns HI, the frequency-comparison circuit may need to be reset to its initialization state before performing another comparison. In a typical implementation, control logic (not shown) can be used to detect any 'speed up' or 'slow down' output signals 422, adjust clk1 and/or clk2 accordingly, and then reset the frequency-comparison circuit to compare the newly adjusted input clocks 408.

Figure 6:
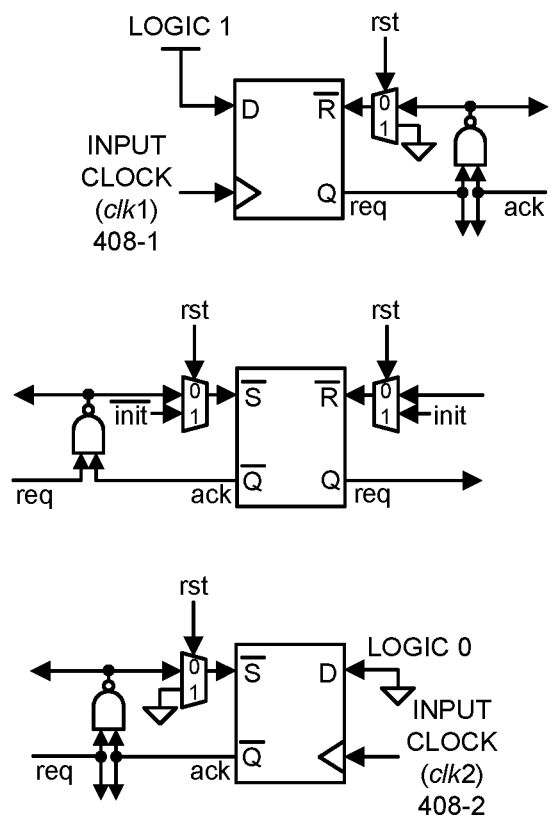
FIG. 6 is a block diagram illustrating initialization circuits in a frequency-comparison circuit in accordance with an embodiment of the present disclosure.

In order to realize the initialization state of the frequency-comparison circuit, modifications to the embodiments shown in FIGS. 4 and 5 may be needed. In particular, multiplexers selectable by a reset ('rst') signal may be added for loading the appropriate initialization states into the respective flip-flops and SR latches. The modifications to the flip-flops and latches are illustrated in FIG. 6, which presents a block diagram illustrating initialization circuits in a frequency-comparison circuit. Note that the 'init' variable in FIG. 6 represents the initialization value described previously, and the initialization states may be loaded when 'rst' goes HI.

Figure 7:
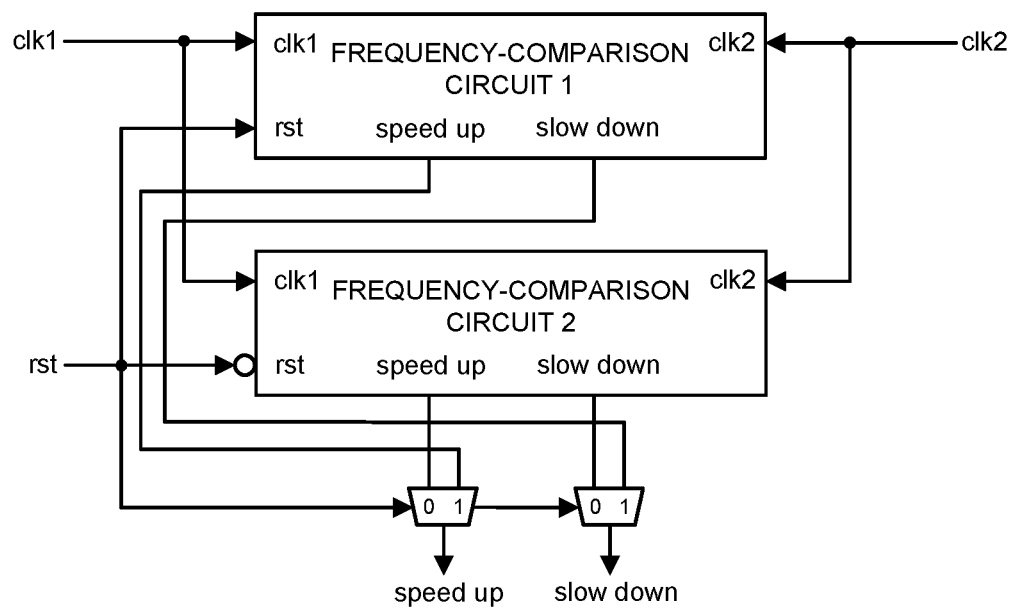
FIG. 7 is a block diagram illustrating a two frequency-comparison circuit topology in a frequency-comparison circuit in accordance with an embodiment of the present disclosure.

While the reset signal is HI, the frequency-comparison circuit may be held in the reset state. This can be exploited in a two frequency-comparison circuit topology in a frequency-comparison circuit, as shown in FIG. 7. The two frequency-comparison circuit topology may effectively present a frequency-comparison circuit that is always available, despite each of the individual constituent frequency-comparison circuits requiring a reset between comparisons. For example, frequency-comparison circuit 1 may be held in reset while frequency-comparison circuit 2 performs the clock comparison. Then, when frequency-comparison circuit 2 requires a reset, frequency-comparison circuit 1 may be available to perform the next clock comparison. Note that the multiplexers may select the appropriate one of 'speed up' and 'slow down' output signals 422 based on the reset signal.

Figure 8:
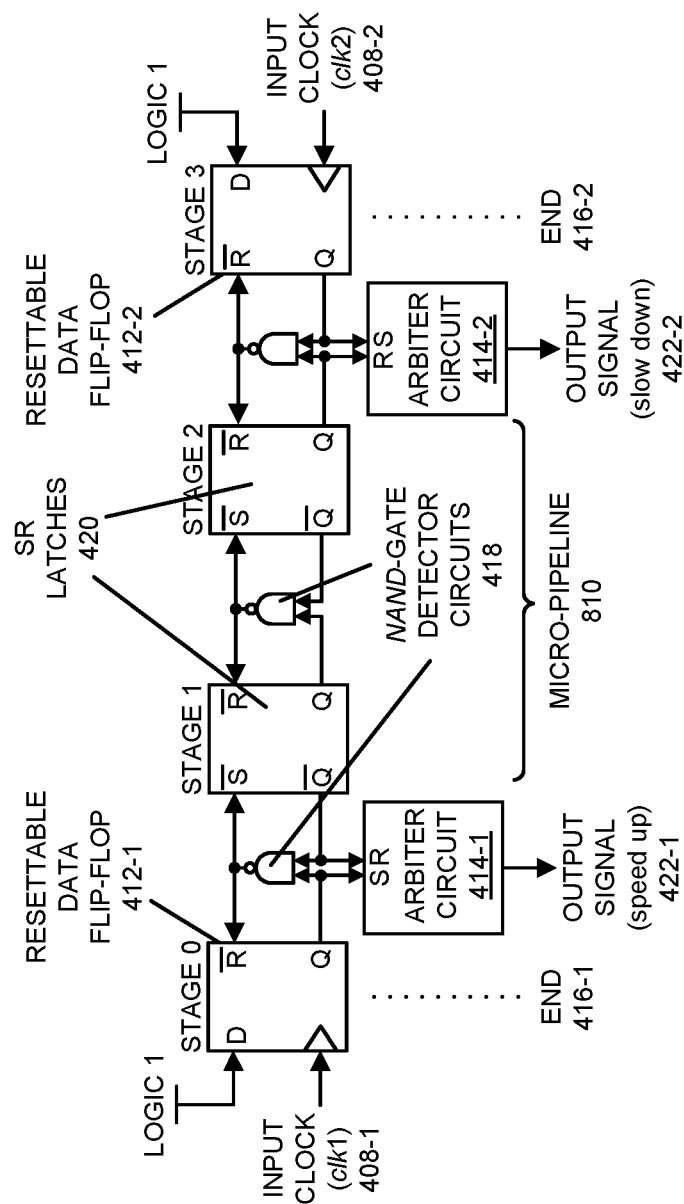
FIG. 8 is a block diagram illustrating a frequency-comparison circuit in accordance with an embodiment of the present disclosure.
Figure 9:
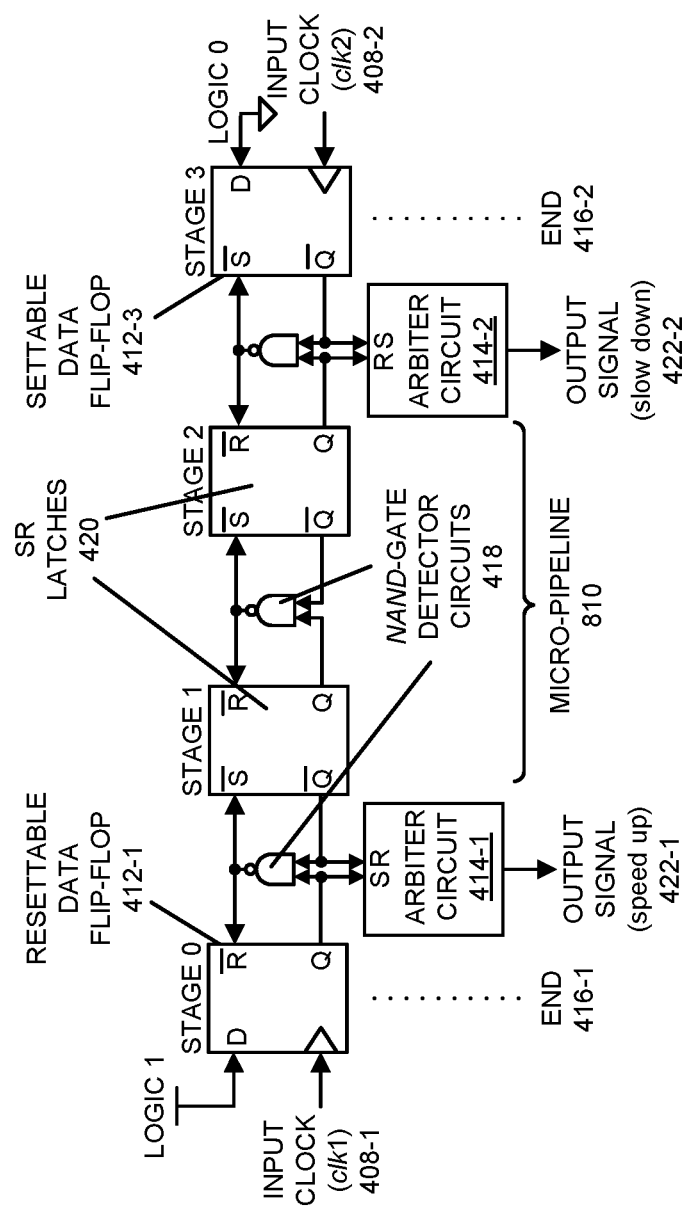
FIG. 9 is a block diagram illustrating a frequency-comparison circuit in accordance with an embodiment of the present disclosure.
Figure 10:
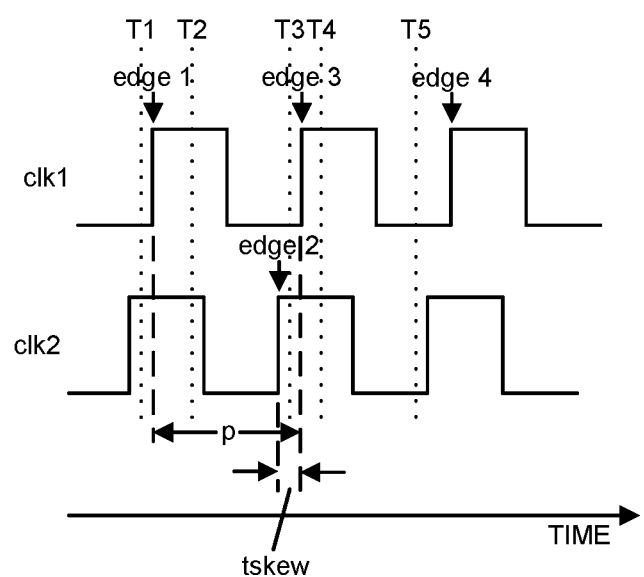
FIG. 10 is a timing diagram illustrating input clocks in accordance with an embodiment of the present disclosure.

While the previous embodiments illustrated the frequency-comparison circuit with six stages, the frequency-comparison circuit can also be implemented using four stages. This is shown in FIGS. 8 and 9, which present block diagrams illustrating frequency-comparison circuits with micro-pipeline 810. Note that the initialization state for stages 0-3 in FIG. 8 may be 0, 0, 1, 0, and the initialization state for stages 0-3 in FIG. 9 may be 0, 0, 1, 1. (In FIG. 9, data flip-flop 412-3 is settable, but is not resettable.) However, a frequency-comparison circuit with four stages may not be able to handle all possible phase differences between the compared input clocks 408. One such corner case is shown in FIG. 10, which presents a timing diagram illustrating input clocks 408. Note that only the rising edges of a given clock trigger a change in state, because the frequency-comparison circuit uses positive-edge flip-flops. Moreover, note that the phase difference is indicated as tskew and the clock period is p. In this example, both of input clocks 408 have the same fundamental frequency.

Table 2 summarizes the state of each stage in the frequency-comparison circuit in FIG. 9 through the various time points depicted in FIG. 10. In this example, T1 is the starting point when the frequency-comparison circuit first exits its initialization state. Note the frequency-comparison circuit may only detect rising clock edges because it uses positive-edge flip-flops. At T2, the frequency-comparison circuit detects edge1 and inserts a token into stage 0, which is propagated to stage 1.

TABLE 2

| Time | Stage 0 | Stage 1 | Stage 2 | Stage 3 |
|------|---------|---------|---------|---------|
| T1   | Empty   | Empty   | Full    | Full    |
| T2   | Empty   | Full    | Full    | Full    |
| T3   | Empty   | Full    | Full    | Empty   |

TABLE 2-continued

| Time | Stage 0 | Stage 1 | Stage 2 | Stage 3 |
|------|---------|---------|---------|---------|
| T4   | Full    | Full    | Empty   | Full    |
| T5   | Empty   | Full    | Full    | Full    |

At T3, the frequency-comparison circuit detects edge2 and inserts a space into stage 3. Then, at T4, the token that used to be in stage 2 is moved to fill stage 3. In addition, the frequency-comparison circuit detects edge3 and inserts a token into stage 0. Note that dback is defined as the backward propagation time for a space to move from the last stage to the first stage, and dfwd is defined as the forward propagation time for a token to move from the first stage to the last stage. Because of a finite value of dback, the token removal at stage 3 may not immediately affect the state of stage 0 and stage 1. Thus, for this instance in time at T4, stage 0 may become full while stage 1 remains full, which may cause the 'speed up' output signal 422-1 to go HI, even though the two input clocks 408 have the same fundamental frequency. A similar analysis can be made for the case of false positives on the 'slow down' output signal 422-2.

There are some caveats in this analysis. Note the states at T3 and T4 are unstable, because tokens and spaces are still being exchanged. The exact location of 'empty' is not precisely defined and depends on the propagation time along the micro-pipeline. Moreover, propagation time is a function of the logic-gate design and the semiconductor-process technology used to fabricate the frequency-comparison circuit.

Furthermore, the propagation time may dictate the amount of tolerable phase difference between clk1 and clk2. For a four-stage frequency-comparison circuit, the larger propagation time, either dback or dfwd, may need to be less than the skew (tskew) between clk1 and clk2 in order to avoid false positives on the 'speed up' or 'slow down' output signals 422. This criteria is expressed in Eqn. 1. Note that, because the propagation time is finite in any circuit design, a four-stage design cannot properly handle all possible phase differences between input clocks 408.

$$\max(dback, dfwd) < tskew. \quad (1)$$

In contrast, a six-stage frequency-comparison circuit can properly handle any phase differences between input clocks 408 because the two additional stages allow an additional token or space insertion into the micro-pipeline. These added stages may allow the frequency-comparison circuit to avoid false positives on the 'speed up' or 'slow down' output signals 422. Table 3 provides a state summary for the corner case shown in FIG. 10 in the context of a six-stage design in FIG. 5, and illustrates how the additional stages help handle the skew between clk1 and clk2.

TABLE 3

| Time | Stage 0 | Stage 1 | Stage 2 | Stage 3 | Stage 4 | Stage 5 |
|------|---------|---------|---------|---------|---------|---------|
| T1   | Empty   | Empty   | Empty   | Full    | Full    | Full    |
| T2   | Empty   | Empty   | Full    | Full    | Full    | Full    |
| T3   | Empty   | Empty   | Full    | Full    | Full    | Empty   |
| T4   | Empty   | Full    | Full    | Full    | Empty   | Full    |
| T5   | Empty   | Empty   | Full    | Full    | Full    | Full    |

Note that the actual location of 'empty' at T3 and T4 in Table 3 is not entirely clear because spaces and tokens are actively being exchanged. The exact location depends on the process technology and logic-gate design. The main takeaway from Table 3 is that the propagation time (dback or dfwd) is much less than the clock period p in a proper design so that stage 1 becomes empty by T5, which is before edge4 arrives to fill stage 0 with a token (which would otherwise trigger a false positive on the 'speed up' output signal 422-1). For the case of potential false positives on the 'slow down' output signal 422-2, a similar analysis can be made for space insertions. The described criteria for correct operation in a six-stage design is summarized in Eqn. 2. As long as p is chosen to satisfy the inequality of Eqn. 2, the six-stage design will not give false positives on its output signals 422. As previously mentioned, dback and dfwd are generally less than p. In addition, the minimum value of p allowed by Eqn. 2 determines the maximum fundamental frequencies of input clocks 408 that the frequency-comparison circuit can correctly compare.

$$\max(dback, dfwd) - p \leq tskew. \quad (2)$$

Similarly, a frequency-comparison circuit with more than six stages can also handle all phase differences between clk1 and clk2. However, there is a trade-off associated with increasing the number of stages. As more stages are added to a micro-pipeline, more tokens or spaces are respectively needed to trigger the 'speed up' or 'slow down' output signals 422. The accumulation of one more token or space occurs when the frequency-comparison circuit 'sees' one more edge on one of input clocks 408 than on the other. Consequently, including more stages typically increases the time needed by the frequency-comparison circuit to accumulate the required tokens or spaces. Thus, the response time of the frequency-comparison circuit to reach a decision is usually increased. Moreover, the relative speed difference between the two input clocks 408 may also play a role. If the difference is small, the frequency-comparison circuit may take a relatively long time to detect the edge count differences between the two input clocks 408. Additionally, the absolute clock period, or the time between edges, may determine how much time is needed for the entire comparison process. All these effects are captured in Eqn. 3

$$Tresponse > \frac{n \cdot p^2}{2\Delta}, \quad (3)$$

where Tresponse is the response time required for the frequency-comparison circuit to make a decision, n is the number of stages, p is the minimum clock period of clk1 and clk2, and $\Delta$ is the absolute period difference between clk1 and clk2.

Figure 11:
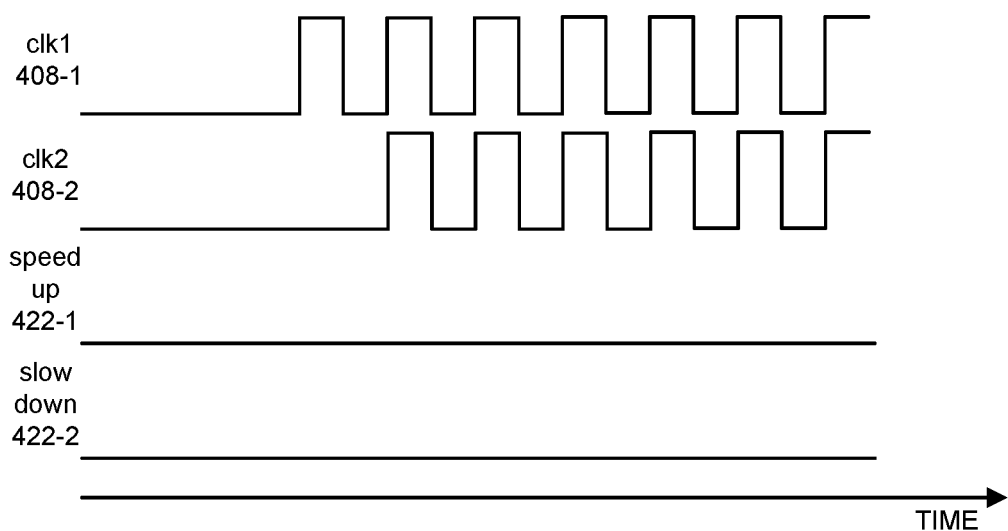
FIG. 11 is a timing diagram illustrating input clocks and output signals from a frequency-comparison circuit in accordance with an embodiment of the present disclosure.
Figure 12:
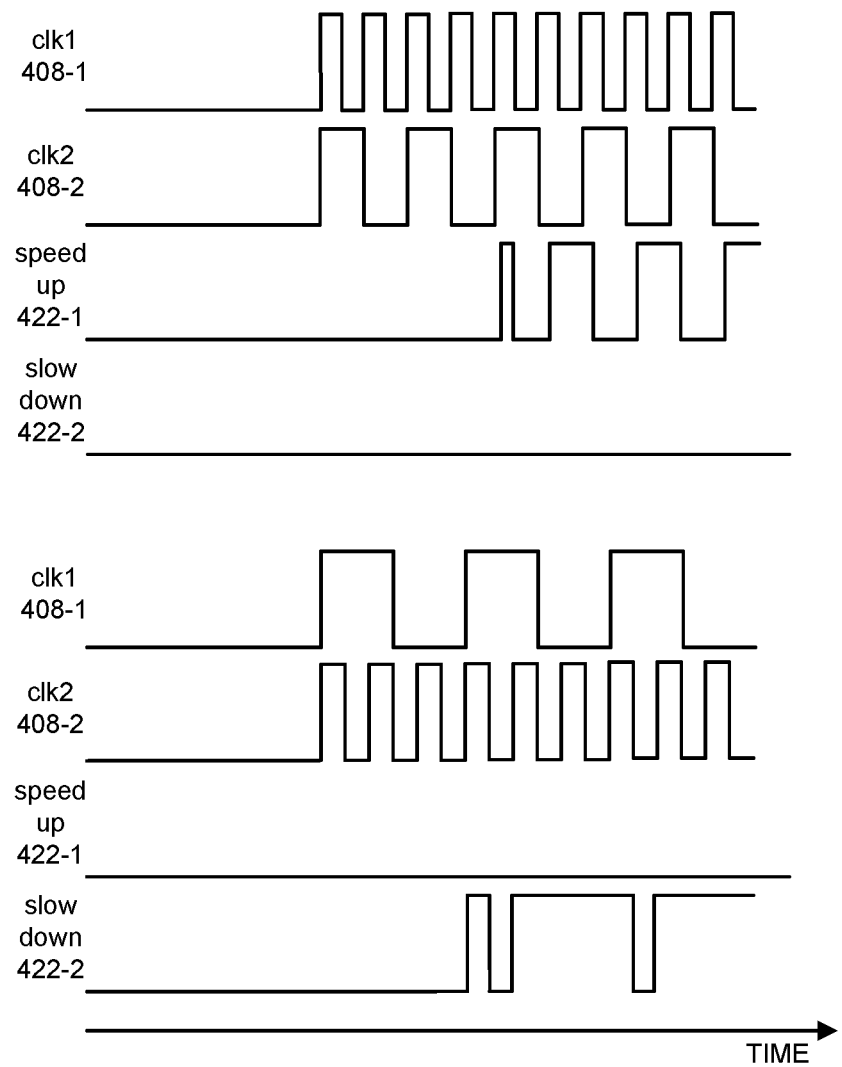
FIG. 12 is a timing diagram illustrating input clocks and output signals from a frequency-comparison circuit in accordance with an embodiment of the present disclosure.

FIGS. 11 and 12 present timing diagrams illustrating simulated input clocks 408 and output signals 422 from a six-stage frequency-comparison circuit. In FIG. 11, the two input clocks 408 have the same fundamental frequency but with ±360° phase differences. The 'speed up' and 'slow down' output signals 422 remain LO and do not give false positives. In FIG. 12, input clocks 408 have different fundamental frequencies. On the top in FIG. 12, the 'speed up' output signal 422-1 goes HI when clk2 is slower than clk1, and on the bottom the 'slow down' output signal 422-2 goes HI when clk2 is faster than clk1.

In summary, the frequency-comparison circuit includes micro-pipeline logic and arbiter circuits to compare the fundamental frequencies of two input clocks. During operation, the frequency-comparison circuit may be initialized to ensure correct operation. In addition, a minimum of six stages in the frequency-comparison circuit may be needed to handle up to ±360° of phase difference between the input clocks. The proposed frequency-comparison circuit has many applications and is well-suited for use in FLL and PLL designs.

Figure 13:
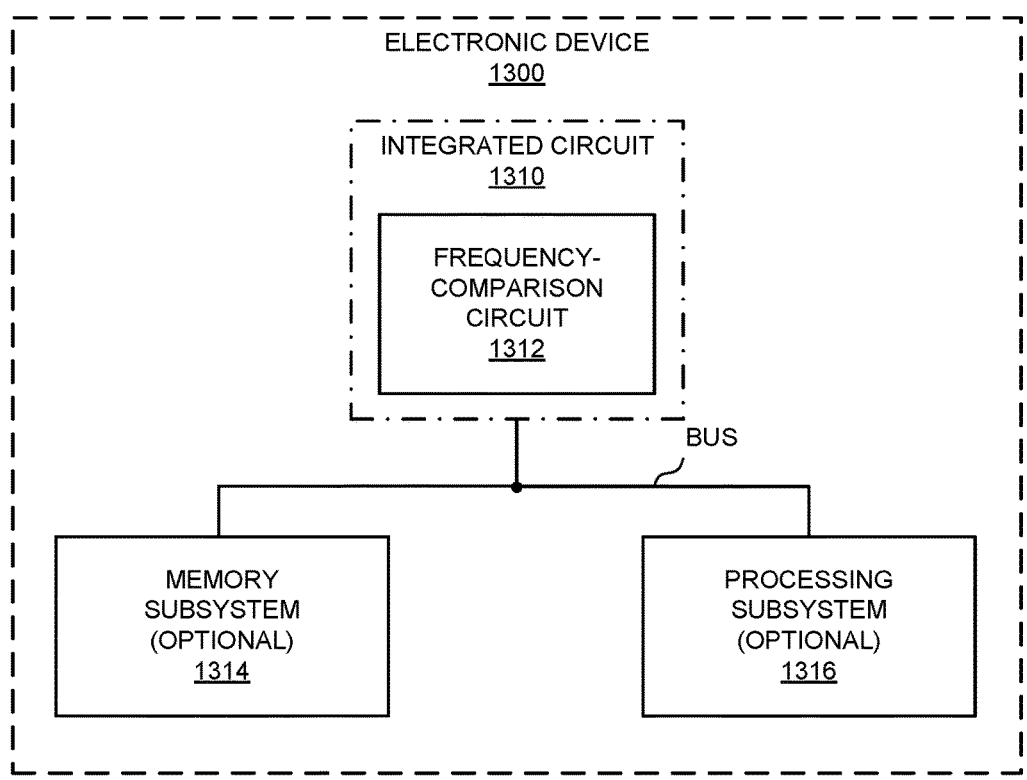
FIG. 13 is a block diagram of an electronic device that includes an integrated circuit with a frequency-comparison circuit in accordance with an embodiment of the present disclosure.

We now describe embodiments of an electronic device that includes the integrated circuit with one of the preceding embodiments of the frequency-comparison circuit. FIG. 13 presents a block diagram of an electronic device 1300 that includes an integrated circuit 1310 with a frequency-comparison circuit 1312. Moreover, electronic device 1300 may include one or more program modules or sets of instructions stored in an optional memory subsystem 1314 (such as DRAM, another type of volatile or non-volatile computer-readable memory, and more generally a memory), which may be executed by an optional processing subsystem 1316 (which may include one or more processors). Note that the one or more computer programs may constitute a computer-program mechanism. Furthermore, instructions in the various modules in optional memory subsystem 1314 may be implemented in: a high-level procedural language, an object-oriented programming language, and/or in an assembly or machine language. Note that the programming language may be compiled or interpreted, e.g., configurable or configured, to be executed by optional processing subsystem 1316.

More generally, embodiments of the integrated circuit may be used in a variety of applications, including: VLSI circuits, communication systems, storage area networks, data centers, networks (such as local area networks), and/or computer systems (such as multiple-core processor computer systems). Note that electronic device 1300 may include, but is not limited to: a server, a laptop computer, a communication device or system, a tablet computer, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

The preceding embodiments may include fewer components or additional components. Although these embodiments are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed.

Furthermore, functionality in these circuits, components and devices is implemented in hardware and/or in software as is known in the art. For example, some or all of the functionality of these embodiments may be implemented in one or more: application-specific integrated circuits (ASICs), field-programmable gate arrays (FPGAs), and/or one or more digital signal processors (DSPs). Additionally, note that circuits in these embodiments may be implemented using PMOS and/or NMOS, and signals may include digital signals that have approximately discrete values and/or analog signals that have continuous values. Thus, the output signals provided by the frequency-comparison circuit may be digital signals and/or analog signals.

In the preceding embodiments, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art (for example, AC coupling and/or DC coupling may be used).

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematics of the type detailed above and the corresponding descriptions and encode the data structures on a computer-readable medium. Those of skill in the art of integrated circuit fabrication can use such encoded data to fabricate integrated circuits comprising one or more of the circuits described herein.

Figure 14:
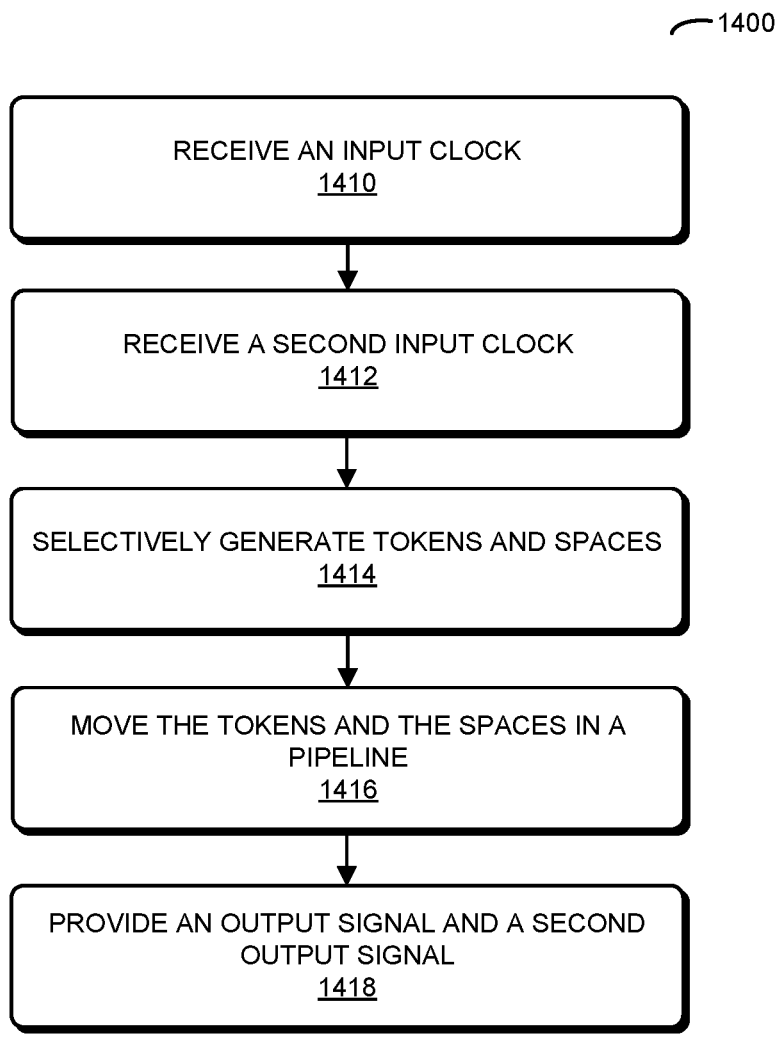
FIG. 14 is a flow chart illustrating a method for comparing an input clock and a second input clock in accordance with an embodiment of the present disclosure.

We now describe embodiments of the method. FIG. 14 presents a flow chart illustrating a method 1400 for comparing an input clock and a second input clock, which may be performed by one of the preceding embodiments of the frequency-comparison circuit. During operation, a resettable data latch at an end of a pipeline in a frequency-comparison circuit receives the input clock (operation 1410) having a fundamental frequency. Then, a second resettable data latch at a second end of the pipeline in the frequency-comparison circuit receives the second input clock (operation 1412) having a second fundamental frequency.

Moreover, the resettable data latch generates tokens and the second resettable data latch selectively generates spaces (operation 1414) based on: rising edges in the input clock and the second input clock; and/or falling edges in the input clock and the second input clock. Next, the frequency-comparison circuit moves the tokens and the spaces in the pipeline (operation 1416) based on a difference in the fundamental frequency and the second fundamental frequency, wherein the tokens are moved from the end to the second end, and the spaces are moved from the second end to the end. Note that the pipeline includes at least a pair of flow-control elements separated by a NAND-gate detector circuit.

Furthermore, an arbiter circuit in the frequency-comparison circuit provides an output signal (operation 1418) based on a change in a number of tokens proximate to the end and a second arbiter circuit in the frequency-comparison circuit provides a second output signal (operation 1418) based on a change in a number of spaces proximate to the second end, to indicate how at least one of the input clocks should be adjusted so that the fundamental frequency and the second fundamental frequency converge on a common value.

In some embodiments of method 1400, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising a frequency-comparison circuit with a pipeline that includes:
   a resettable data latch at an end of the pipeline, wherein, during operation, the resettable data latch receives an input clock having a fundamental frequency;
   an arbiter circuit electrically coupled to the resettable data latch;
   a flow-control element coupled to the resettable data latch and the arbiter circuit;
   a NAND-gate detector circuit electrically coupled to the flow-control element;
   a second flow-control element electrically coupled to the NAND-gate detector circuit;
   a second arbiter circuit electrically coupled to the second flow-control element; and
   a second resettable data latch at a second end of the pipeline electrically coupled to the second flow-control element and the second arbiter circuit, wherein, during operation, the second resettable data latch receives a second input clock having a second fundamental frequency;
   wherein, during operation, the resettable data latch selectively generates tokens and the second resettable data latch selectively generates spaces based on at least one of: rising edges in the input clock and the second input clock; and falling edges in the input clock and the second input clock, and the pipeline moves the tokens and the spaces based on a difference in the fundamental frequency and the second fundamental frequency, wherein the tokens are moved from the end to the second end, and the spaces are moved from the second end to the end; and
   wherein, during operation, the arbiter circuit provides an output signal that specifies an adjustment to one of the input clock and the second input clock based on a change in a number of tokens proximate to the end and the second arbiter circuit provides a second output signal that specifies an adjustment to another one of the input clock and the second input clock based on a change in a number of spaces proximate to the second end, so that the fundamental frequency and the second fundamental frequency converge on a common value.

2. The integrated circuit of claim 1, wherein a given flow-control element includes a set-reset (SR) latch.

3. The integrated circuit of claim 2, wherein, during initialization of the frequency-comparison circuit, Q outputs from the resettable data latch and the flow-control element are set to a first state and the Q outputs from the second flow-control element and the second resettable data latch are set to a second state.

4. The integrated circuit of claim 1, wherein a given flow-control element includes one of: an asP* module, a GasP module, and a Muller C-element.

5. The integrated circuit of claim 1, wherein the frequency-comparison circuit operates asynchronously.

6. The integrated circuit of claim 1, wherein the frequency-comparison circuit further comprises one or more additional instances of flow-control elements and NAND-gate detector circuits arranged in series in the pipeline.

7. The integrated circuit of claim 6, wherein the frequency-comparison circuit further comprises at least four flow-control elements and at least three NAND-gate detector circuits, so that the frequency-comparison circuit avoids false positives in the output signal and the second output signal for an arbitrary value of a phase difference between the input clock and the second input clock.

8. The integrated circuit of claim 7, wherein a difference of a greater of a forward propagation time through the pipeline and a reverse propagation time through the pipeline minus an inverse of one of the fundamental frequency and the second fundamental frequency is less than or equal to a clock skew between the input clock and the second input clock.

9. The integrated circuit of claim 1, wherein the frequency-comparison circuit is included in one of: a phase-locked loop; and a frequency-locked loop.

10. A method for comparing an input clock and a second input clock, wherein the method comprises:
receiving the input clock having a fundamental frequency at a resettable data latch at an end of a pipeline in a frequency-comparison circuit;
receiving the second input clock having a second fundamental frequency at a second resettable data latch at a second end of the pipeline in the frequency-comparison circuit;
selectively generating tokens at the resettable data latch and selectively generating spaces at the second resettable data latch based on one of: rising edges in the input clock and the second input clock; and falling edges in the input clock and the second input clock;
moving the tokens and the spaces in the pipeline based on a difference in the fundamental frequency and the second fundamental frequency, wherein the tokens are moved from the end to the second end, and the spaces are moved from the second end to the end, and wherein the pipeline includes a pair of flow-control elements separated by a NAND-gate detector circuit; and
providing an output signal using an arbiter circuit in the frequency-comparison circuit based on a change in a number of tokens proximate to the end and a second output signal using a second arbiter circuit in the frequency-comparison circuit based on a change in a number of spaces proximate to the second end, to indicate adjustments to at least one of the input clock and the second input clock so that the fundamental frequency and the second fundamental frequency converge on a common value.

11. The method of claim 10, wherein the frequency-comparison circuit is operated asynchronously.

12. An integrated circuit, comprising two instances of a frequency-comparison circuit, wherein a given instance of the frequency-comparison circuit includes a pipeline that includes:
a resettable data latch at an end of the pipeline, wherein, during operation, the resettable data latch receives an input clock having a fundamental frequency;
an arbiter circuit electrically coupled to the resettable data latch;
a flow-control element coupled to the resettable data latch and the arbiter circuit;
a NAND-gate detector circuit electrically coupled to the flow-control element;
a second flow-control element electrically coupled to the NAND-gate detector circuit;
a second arbiter circuit electrically coupled to the second flow-control element; and
a second resettable data latch at a second end of the pipeline electrically coupled to the second flow-control element and the second arbiter circuit, wherein, during operation, the second resettable data latch receives a second input clock having a second fundamental frequency;
wherein, during operation, the resettable data latch selectively generates tokens and the second resettable data latch selectively generates spaces based on at least one of: rising edges in the input clock and the second input clock; and falling edges in the input clock and the second input clock, and the pipeline moves the tokens and the spaces based on a difference in the fundamental frequency and the second fundamental frequency, wherein the tokens are moved from the end to the second end, and the spaces are moved from the second end to the end;
wherein, during operation, the arbiter circuit provides an output signal that specifies an adjustment to one of the input clock and the second input clock based on a change in a number of tokens proximate to the end and the second arbiter circuit provides a second output signal that specifies an adjustment to another one of the input clock and the second input clock based on a change in a number of spaces proximate to the second end, so that the fundamental frequency and the second fundamental frequency converge on a common value; and
wherein, after performing a comparison of the input clock and the second input clock, one of the two instances of the frequency-comparison circuit is reset and initialized while another of the two instances of the frequency-comparison circuit performs another comparison of the input clock and the second input clock.

13. The integrated circuit of claim 12, wherein a given flow-control element includes a set-reset (SR) latch.

14. The integrated circuit of claim 13, wherein, during initialization of the given instance of the frequency-comparison circuit, Q outputs from the resettable data latch and the flow-control element are set to a first state and the Q outputs from the second flow-control element and the second resettable data latch are set to a second state.

15. The integrated circuit of claim 12, wherein a given flow-control element includes one of: an asP* module, a GasP module, and a Muller C-element.

16. The integrated circuit of claim 12, wherein the two instances of the frequency-comparison circuit operate asynchronously.

17. The integrated circuit of claim 12, wherein the given instance of the frequency-comparison circuit further comprises one or more additional instances of flow-control elements and NAND-gate detector circuits arranged in series in the pipeline.

18. The integrated circuit of claim 17, wherein the given instance of the frequency-comparison circuit further comprises at least four flow-control elements and at least three NAND-gate detector circuits, so that the given instance of the frequency-comparison circuit avoids false positives in the output signal and the second output signal for an arbitrary value of a phase difference between the input clock and the second input clock.

19. The integrated circuit of claim 18, wherein a difference of a greater of a forward propagation time through the pipeline and a reverse propagation time through the pipeline minus an inverse of one of the fundamental frequency and the second fundamental frequency is less than or equal to a clock skew between the input clock and the second input clock.

20. The integrated circuit of claim 12, wherein the two instances of the frequency-comparison circuit are included in one of: a phase-locked loop; and a frequency-locked loop.

* * * * *

UNITED STATES PATENT AND TRADEMARK OFFICE
CERTIFICATE OF CORRECTION

PATENT NO. : 9,621,141 B1
APPLICATION NO. : 14/992905
DATED : April 11, 2017
INVENTOR(S) : Yang et al.

Page 1 of 1

It is certified that error appears in the above-identified patent and that said Letters Patent is hereby corrected as shown below:

In the Specification

In Column 2, Lines 65-67, delete "Other features, aspects, and advantages of the subject matter described herein will become apparent from the following Detailed Description, Figures, and Claims." and insert the same on Column 2, Line 64 as a continuation of the same paragraph.

In Column 6, Line 9, delete "argument." and insert -- argument, --, therefor.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*